(12) United States Patent
Li (10) Patent No.: US 7,495,290 B2
(45) Date of Patent: Feb. 24, 2009

(54) SEMICONDUCTOR DEVICES AND METHODS OF MANUFACTURE THEREOF

(75) Inventor: Hong-Jyh Li, Austin, TX (US)

(73) Assignee: Infineon Technologies AG, Munich (DE)

( * ) Notice: Subject to any disclaimer, the term of this patent is extended or adjusted under 35 U.S.C. 154(b) by 81 days.

(21) Appl. No.: 11/300,050

(22) Filed: Dec. 14, 2005

(65) Prior Publication Data

US 2007/0131972 A1    Jun. 14, 2007

(51) Int. Cl.
H01L 29/76    (2006.01)

(52) U.S. Cl. .................. 257/369; 257/412; 257/413; 257/E29.264

(58) Field of Classification Search .................. 257/369
See application file for complete search history.

(56) References Cited

U.S. PATENT DOCUMENTS

| | | | |
|---|---|---|---|
| 4,432,035 A | | 2/1984 | Hsieh et al. |
| 4,990,974 A | | 2/1991 | Vinal |
| 5,041,885 A | | 8/1991 | Gualandris et al. |
| 5,066,995 A | | 11/1991 | Young et al. |
| 5,162,263 A | | 11/1992 | Kunishima et al. |
| 5,321,287 A | | 6/1994 | Uemura et al. |
| 5,352,631 A | * | 10/1994 | Sitaram et al. .......... 438/300 |
| 5,763,922 A | | 6/1998 | Chau |
| 5,994,747 A | | 11/1999 | Wu |
| 6,020,243 A | | 2/2000 | Wallace et al. |
| 6,027,961 A | | 2/2000 | Maiti et al. |
| 6,048,769 A | | 4/2000 | Chau |
| 6,084,280 A | | 7/2000 | Gardner et al. |
| 6,124,171 A | | 9/2000 | Arghavani et al. |
| 6,159,782 A | | 12/2000 | Xiang et al. |
| 6,184,072 B1 | | 2/2001 | Kaushik et al. |
| 6,225,163 B1 | | 5/2001 | Bergemont |
| 6,291,867 B1 | | 9/2001 | Wallace et al. |
| 6,348,390 B1 | | 2/2002 | Wu |
| 6,373,111 B1 | | 4/2002 | Zheng et al. |
| 6,410,967 B1 | | 6/2002 | Hause et al. |
| 6,444,555 B2 | | 9/2002 | Ibok |

(Continued)

FOREIGN PATENT DOCUMENTS

EP    1 388 889 A2    2/2004

(Continued)

OTHER PUBLICATIONS

Chang, L., et al., "Extremely Scaled Silicon Nano-CMOS Devices," Proceedings of the IEEE, Nov. 2003, pp. 1860-1873, vol. 91, No. 11, IEEE, Los Alamitos, CA.
"Front End Processes," The International Technology Roadmap for Semiconductors: 2002 Update, pp. 45-62, http://member.itrs.net/.
"Front End Processes," The International Technology Roadmap for Semiconductors: 2003 Edition, pp. 23-25, http://member.itrs.net/.
Gannavaram, S., et al., "Low Temperature ($\leqq 800°C$) Recessed Junction Selective Silicon-Germanium Source/Drain Technology for sub-70 nm CMOS," 2000, 4 pp., IEEE, Los Alamitos, CA.
Guha, S., et al., "Atomic Beam Deposition of Lanthanum- and Yttrium-Based Oxide Thin Films for Gate Dielectrics," Applied Physics Letters, Oct. 23, 2000, pp. 2710-2712, vol. 77, No. 17, American Institute of Physics, Melville, NY.

(Continued)

*Primary Examiner*—Tu-Tu V Ho
(74) *Attorney, Agent, or Firm*—Slater & Matsil, L.L.P.

(57) ABSTRACT

Methods of forming transistors and structures thereof are disclosed. A preferred embodiment comprises a semiconductor device including a workpiece, a gate dielectric disposed over the workpiece, and a thin layer of conductive material disposed over the gate dielectric. A layer of semiconductive material is disposed over the thin layer of conductive material. The layer of semiconductive material and the thin layer of conductive material comprise a gate electrode of a transistor. A source region and a drain region are formed in the workpiece proximate the gate dielectric. The thin layer of conductive material comprises a thickness of about 50 Angstroms or less.

8 Claims, 3 Drawing Sheets

U.S. PATENT DOCUMENTS

| | | |
|---|---|---|
| 6,448,127 B1 | 9/2002 | Xiang et al. |
| 6,475,908 B1 | 11/2002 | Lin et al. |
| 6,492,217 B1 | 12/2002 | Bai et al. |
| 6,528,858 B1 | 3/2003 | Yu et al. |
| 6,656,764 B1 | 12/2003 | Wang et al. |
| 6,693,333 B1 | 2/2004 | Yu |
| 6,716,685 B2 | 4/2004 | Lahaug |
| 6,720,221 B1 | 4/2004 | Ahn et al. |
| 6,740,944 B1 | 5/2004 | McElheny et al. |
| 6,852,645 B2 | 2/2005 | Colombo et al. |
| 6,897,095 B1 | 5/2005 | Adetutu et al. |
| 6,921,691 B1 | 7/2005 | Li et al. |
| 7,060,568 B2 | 6/2006 | Metz et al. |
| 7,091,568 B2 | 8/2006 | Hegde et al. |
| 2002/0005556 A1 | 1/2002 | Cartier et al. |
| 2002/0053711 A1 | 5/2002 | Chau et al. |
| 2002/0135030 A1 | 9/2002 | Horikawa |
| 2002/0135048 A1 | 9/2002 | Ahn et al. |
| 2002/0151125 A1 | 10/2002 | Kim et al. |
| 2002/0153573 A1 | 10/2002 | Mogami |
| 2003/0057432 A1 | 3/2003 | Gardner et al. |
| 2003/0104663 A1 | 6/2003 | Visokay et al. |
| 2003/0116804 A1 | 6/2003 | Visokay et al. |
| 2003/0137017 A1 | 7/2003 | Hisamoto et al. |
| 2003/0141560 A1 | 7/2003 | Sun |
| 2003/0219953 A1 | 11/2003 | Mayuzumi |
| 2004/0000695 A1 | 1/2004 | Matsuo |
| 2004/0005749 A1 | 1/2004 | Choi et al. |
| 2004/0009675 A1 | 1/2004 | Eissa et al. |
| 2004/0023462 A1 | 2/2004 | Rotondaro et al. |
| 2004/0132271 A1 | 7/2004 | Ang et al. |
| 2004/0171222 A1 | 9/2004 | Gao et al. |
| 2004/0180487 A1* | 9/2004 | Eppich et al. ............... 438/199 |
| 2004/0217429 A1 | 11/2004 | Lin et al. |
| 2004/0242021 A1 | 12/2004 | Kraus et al. |
| 2005/0035345 A1 | 2/2005 | Lin et al. |
| 2005/0064663 A1 | 3/2005 | Saito |
| 2005/0098839 A1 | 5/2005 | Lee et al. |
| 2005/0101159 A1 | 5/2005 | Droopad |
| 2005/0139926 A1 | 6/2005 | Shimizu et al. |
| 2005/0224897 A1 | 10/2005 | Chen et al. |
| 2005/0245019 A1 | 11/2005 | Luo et al. |
| 2005/0280104 A1 | 12/2005 | Li |
| 2006/0003507 A1* | 1/2006 | Jung et al. .................. 438/197 |
| 2006/0017112 A1 | 1/2006 | Wang et al. |
| 2006/0038236 A1 | 2/2006 | Yamamoto |
| 2006/0118879 A1 | 6/2006 | Li |
| 2006/0125018 A1* | 6/2006 | Lee et al. .................... 257/369 |
| 2006/0131652 A1 | 6/2006 | Li |
| 2006/0141729 A1 | 6/2006 | Wang et al. |
| 2006/0211195 A1* | 9/2006 | Luan .......................... 438/240 |
| 2006/0292773 A1* | 12/2006 | Goolsby et al. ............. 438/197 |
| 2007/0020903 A1* | 1/2007 | Takehara et al. ............ 438/592 |
| 2007/0034945 A1 | 2/2007 | Bohr et al. |

FOREIGN PATENT DOCUMENTS

| | | |
|---|---|---|
| EP | 1 531 496 A2 | 5/2005 |
| JP | 2002118175 | 4/2002 |
| JP | 2004289061 | 10/2004 |
| WO | WO 01/66832 A2 | 9/2001 |
| WO | WO 2004/095556 A1 | 11/2004 |
| WO | WO 2005/114718 A1 | 12/2005 |
| WO | WO 2006/061371 A1 | 6/2006 |
| WO | WO 2006/067107 A1 | 6/2006 |

OTHER PUBLICATIONS

"High κ Dielectric Materials," Tutorial: Materials for Thin Films / Microelectronics, http://www.sigmaaldrich.com/Area_of_Interest/ Organic_Inorganic_Chemistry/Materials_Science/ Thin_Films_Microelectronics/Tutorial/Dielectric_Materials.html, downloaded Jun. 9, 2004, 3 pp., Sigma-Aldrich Co., St. Louis, MO.

Hobbs, C., et al., "Fermi Level Pinning at the PolySi/Metal Oxide Interface," 2003 Symposium on VLSI Technology Digest of Technical Papers, Jun. 2003, 2 pp., IEEE, Los Alamitos, CA.

Huang, F. J., et al., "Schottky-Clamped NMOS Transistors Implemented in a Conventional 0.8-μm CMOS Process," IEEE Electron Device Letters, Sep. 1998, pp. 326-328, vol. 19, No. 9, IEEE, Los Alamitos, CA.

Muller, R.S., et al., "Device Electronics for Integrated Circuits," Second Ed., 1986, pp. 380-385, 398-399, John Wiley & Sons, New York, NY.

Nowak, E.J., et al., "Turning Silicon on its Edge: Overcoming Silicon Scaling Barriers with Double-Gate and FinFET Technology," IEEE Circuits & Devices Magazine, Jan./Feb. 2004, pp. 20-31, IEEE, Los Alamitos, CA.

Park, D.-G., et al., "Thermally Robust Dual-Work Function ALD-$MN_x$ MOSFETs using Conventional CMOS Process Flow," 2004 Symposium on VLSI Technology Digest of Technical Papers, 2004, pp. 186-187, IEEE, Los Alamitos, CA.

Samavedam, S.B., et al., "Fermi Level Pinning with Sub-Monolayer MeOx and Metal Gates," Mar. 2003, 4 pp., IEEE, Los Alamitos, CA.

Wolf, S., "Silicon Processing for the VLSI Era: Vol. II—CMOS Process Integration," 1990, pp. 432-441, Lattice Press, Sunset Beach, CA.

Yu, B., et al., "FinFET Scaling to 10nm Gate Length," IEDM, 2002, pp. 251-254, IEEE, Los Alamitos, CA.

Choi, Y-K., et al., "FinFET Process Refinements for Improved Mobility and Gate Work Function Engineering," IEDM, 2002, pp. 259-262, IEEE, Los Alamitos, CA.

Choi, Y-K, et al., "Sub-20nm CMOS FinFET Technologies," IEDM, 2001, pp. 421-424, IEEE, Los Alamitos, CA.

Lin, R., et al., "An Adjustable Work Function Technology Using Mo Gate for CMOS Devices," IEEE Electron Device Letters, Jan. 2002, pp. 49-51, vol. 23, No. 1, IEEE, Los Alamitos, CA.

Wakabayashi, H., et al., "A Dual-Metal Gate CMOS Technology Using Nitrogen-Concentration-Controlled TiNx Film," IEEE Transactions on Electron Devices, Oct. 2001, pp. 2363-2369, vol. 48, No. 10, IEEE, Los Alamitos, CA.

Hobbs, C.C., et al., "Fermi-Level Pinning at the Polysilicon/Metal Oxide Interface—Part I," IEEE Transactions on Electron Devices, vol. 51, No. 6, Jun. 2004, pp. 971-977.

Li, H.-J., et al., "Dual High-κ Gate Dielectric with Poly Gate Electrode: HfSiON on nMOS and $Al_2O_3$ Capping Layer on pMOS," IEEE Electron Device Letters, vol. 26, No. 7, Jul. 2005, pp. 441-444.

Cho, B., et al. "HfSi Gate Electrode with Tunable Work Function for Advanced CMOS Devices," http://web.archive.org/web/20040814183959/http://www.eng.nus.edu.sg/EResnews/0406/rd/rd 7.html, Aug. 2004.

Choi, K., et al., "Growth Mechanism of TiN Films on Dielectric Films and the Effects on the Work Function," Thin Solid Film 486, 2005, pp. 141-144, Elsevier.

Gao, W., et al., "Stacked Metal Layers as Gates for MOSFET Threshold Voltage Control," Materials Research Society Symposium, 2003, pp. 3-8, vol. 765.

Li, T.L., et al., "Continuous and Precise Work Function Adjustment for Integratable Dual Metal Gate CMOS Technology Using Hf-Mo Binary Alloys," IEEE Transactions on Electron Devices, Jun. 2005, pp. 1172-1179, vol. 52, No. 6.

Polishchuk, I., et al., "Dual Work Function Metal Gate CMOS Transistors Fabricated by Ni-Ti Interdiffusion," IEEE Electron Device Letters, Apr. 2002, pp. 411-414, vol. 23, Issue 4.

Polishchuk, I., et al., "Polycrystalline Silicon/Metal Stacked Gate for Threshold Voltage Control in Metal-Oxide-Semiconductor Field-Effect Transistors," Applied Physics Letters, Apr. 3, 2000, pp. 1938-1940, vol. 76, No. 14, 2000 American Institute of Physics.

Samavedam, S.B., et al., "Dual-Metal Gate CMOS with $HfO_2$ Gate Dielectric," Electron Devices Meeting, IEEE, 2002, pp. 433-436.

Samavedam, S.B., et al., "Evaluation of Candidate Metals for Dual-Metal Gate CMOS with $HfO_2$ Gate Dielectric," Materials Research Society Symposium, 2002, pp. 85-90, vol. 716, Materials Research Society.

Wolf, S., et al., "Silicon Processing for the VLSI Era," vol. 1-Process Technology, pp. 388 and 526, Second Edition, Lattice Press, Sunset Beach, CA, 2000.

Yeo, Y.C., et al., "Dual-Metal Gate CMOS Technology with Ultrathin Silicon Nitride Gate Dielectric," IEEE Electron Device Letters, May 2001, pp. 227-229, vol. 22, No. 5.

* cited by examiner

SEMICONDUCTOR DEVICES AND METHODS OF MANUFACTURE THEREOF

CROSS-REFERENCE TO RELATED APPLICATIONS

This application relates to the following co-pending and commonly assigned U.S. patent application Ser. No. 11/187,197, filed on Jul. 21, 2005, entitled, "CMOS Transistors With Dual High-k Gate Dielectric and Methods of Manufacture Thereof"; and Ser. No. 10/870,616, filed on Jun. 17, 2004, entitled, "CMOS Transistor With Dual High-k Gate Dielectric and Method of Manufacture Thereof"; which applications are hereby incorporated here by reference.

TECHNICAL FIELD

The present invention relates generally to the fabrication of semiconductor devices, and more particularly to the fabrication of transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET), as an example.

Early MOSFET processes used one type of doping to create either positive or negative channel transistors. More recent designs, referred to as complimentary MOS (CMOS) devices, use both positive and negative channel devices, e.g., a positive channel metal oxide semiconductor (PMOS) transistor and a negative channel metal oxide semiconductor (NMOS) transistor arranged in complimentary configurations. An NMOS device negatively charges so that the transistor is turned on or off by the movement of electrons, whereas a PMOS devices involves the movement of electron vacancies. While the manufacture of CMOS devices requires more manufacturing steps and more transistors, CMOS devices are advantageous because they utilize less power, and the devices may be made smaller and faster.

There is a trend towards reducing the size of semiconductor devices in the industry. However, manufacturing challenges are introduced as the dimensions of the various material layers are decreased, and patterning the material layers in smaller and smaller dimensions is also problematic.

Another trend in the semiconductor industry is the use of high dielectric constant (k) dielectric materials for a gate dielectric material of transistors. High k dielectric materials have a dielectric constant of greater than about 4.0, e.g., greater than the dielectric constant of $SiO_2$, which has been used as a gate dielectric material of transistors for many years. Because of their increased insulative properties, high k dielectric materials may be used in thinner dimensions than $SiO_2$ in transistor applications. However, the use of high k dielectric materials results in undesirable effects on the transistor, to be described further herein.

Thus, what are needed in the art are improved transistors and methods of manufacture thereof.

SUMMARY OF THE INVENTION

These and other problems are generally solved or circumvented, and technical advantages are generally achieved, by preferred embodiments of the present invention which provide novel methods of manufacturing transistors and structures thereof.

In accordance with a preferred embodiment of the present invention, a semiconductor device includes a workpiece, a gate dielectric disposed over the workpiece, and a thin layer of conductive material disposed over the gate dielectric. A layer of semiconductive material is disposed over the thin layer of conductive material. The layer of semiconductive material and the thin layer of conductive material comprise a gate electrode of a transistor. A source region and a drain region are formed in the workpiece proximate the gate dielectric. The thin layer of conductive material comprises a thickness of about 50 Angstroms or less.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
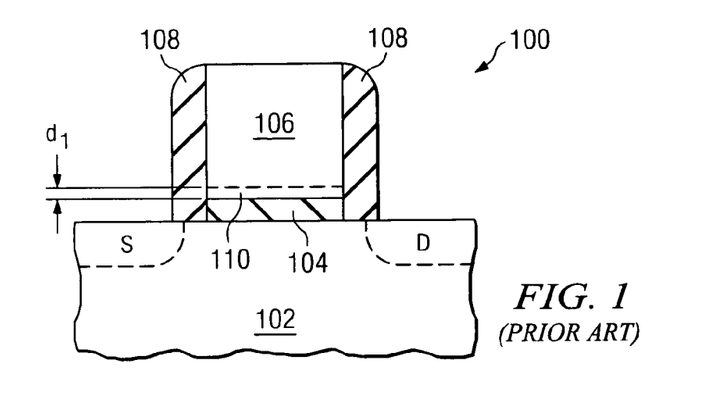
FIG. 1 is a cross-sectional view of a prior art transistor that exhibits a polysilicon (poly) depletion effect.

FIG. 1 is a cross-sectional view of a prior art transistor 100 that exhibits a poly depletion effect. Conventional transistors 100 are formed by depositing a gate dielectric material 104 comprising $SiO_2$ or SiN over a workpiece 102, and depositing a gate material 106 comprising polysilicon over the gate dielectric material 104. The gate material 106 and the gate dielectric material 104 are patterned into the shape of a gate 106 and gate dielectric 104 of a transistor using lithography. Sidewall spacers 108 are formed on the sidewalls of the gate 106 and the gate dielectric 104, and a source region S and drain region D are formed in the workpiece 102 proximate the gate 106 and gate dielectric 104, as shown.

If the transistor 100 comprises an NMOS transistor, the polysilicon gate 106 is doped with an N type dopant such as arsenic. If the transistor 100 comprises a PMOS transistor, the polysilicon gate 106 is doped with a P type dopant such as boron. However, boron diffuses easily into adjacent material layers. Thus, doping the gate 106, e.g., with boron, can present problems, because if too high of a dopant concentration is implanted into the gate 106, the dopant can penetrate the gate dielectric 104 and also diffuse into the workpiece 102 beneath the gate dielectric 104. If the dopant enters the gate dielectric 104, leakage issues can be caused, and if the dopant enters the workpiece 102, the off state leakage current may be increased, which increases the power consumption. This problem is referred to in the art as "boron penetration," where the boron dopant species does not remain in the gate 106, but rather, diffuses to other areas (104, 102) where the dopant does not belong, causing device 100 problems.

To avoid this problem in the prior art, the amount of dopants implanted into the gate 106 are sometimes limited; e.g., the amount of dopant, e.g., boron, is reduced to a minimum. However, this can result in carrier depletion in the polysilicon gate 106. For example, if the device 100 comprises a PMOS transistor 100, the PMOS transistor 100 is typically operated by applying a negative voltage to the polysilicon gate 106. The majority carrier when the gate 106 is doped with boron is a P type carrier or holes. When a negative voltage is applied to the polysilicon gate 106, holes are depleted in a region 110 close to or proximate the gate dielectric 104, as shown in FIG. 1. The depletion region 110 may extend from the interface of the gate dielectric 104 to the gate 106 (e.g., where the gate dielectric 104 abuts the gate 106) upwardly into the gate 106 by an amount $d_1$ of about 200 to 500 Angstroms, for example. Carriers (e.g., the holes) are depleted in the depletion region 110, which increases the capacitance effective thickness (CET) of the transistor 100, e.g., by about 4 to 5 Angstroms. The depletion region 110 comprises a polysilicon (poly) depletion effect that degrades the electrical characteristics of the transistor 100 and increases the effective gate dielectric 104 thickness. For example, the effective electric thickness of the gate dielectric 104 may be increased by the thickness $d_1$ of the poly depletion region 110.

The CET is often represented in the art as $T_{inv}$, which is the inversion oxide thickness of the gate dielectric 104. The use of polysilicon as a gate 106 material exhibits a poly depletion effect which increases $T_{inv}$ by about 4 to 5 Angstroms. In technologies having a very small minimum feature size, e.g., such as about 45 nm or less, a 5 Angstroms increase in $T_{inv}$ may comprise approximately a 25% performance reduction, e.g., if the targeted $T_{inv}$ is 20 Angstroms, for example.

The poly depletion effect is caused by a reduction in the amount of carriers in the polysilicon gate 106 when the device 100 is turned on; e.g., a voltage "high" for an NMOS device 100 and a voltage "low" for a PMOS device 100. During operation of the device 100, the high voltage applied to the NMOS device (e.g., which comprises n+ doped polysilicon in this case) drives the carriers (electrons) out of the polysilicon gate 106/gate dielectric 104 interface (e.g., at depletion region 108) and causes the depletion region 108 to form at the interface of the gate 106 to the gate dielectric 104.

Thus, what are needed in the art are gate electrode materials and transistor designs that do not exhibit a poly depletion effect.

In electronics, the "work function" is the energy, usually measured in electron volts, needed to remove an electron from the Fermi level to a point an infinite distance away outside the surface. Work function is a material property of any material, whether the material is a conductor, semiconductor, or dielectric. The work function of a semiconductor can be changed by doping the semiconductor material. For example, undoped polysilicon has a work function of about 4.5 eV, whereas polysilicon doped with boron has a work function of about 5.0 eV. The work function of a semiconductor or conductor directly affects the threshold voltage of a transistor when the material is used as a gate electrode.

In prior art transistor devices such as device 100 shown in FIG. 1 utilizing $SiO_2$ or SiN as the gate dielectric material 104, the work function of the transistor 100 could be changed or tuned by doping the polysilicon used for the gate electrode material 106. As mentioned earlier, there is a trend in the semiconductor industry towards the use of high k dielectric materials as gate dielectrics, to achieve a reduced gate dielectric 104 thickness. However, high-k gate dielectric materials such as hafnium-based dielectric materials exhibit Fermi-pinning, which is caused by the interaction of the high-k gate dielectric materials with adjacent materials, e.g., the gate material. When used as a gate dielectric, high k gate dielectric materials pin or fix the work function, so that doping the polysilicon gate material does not change the work function of the transistor, resulting in the inability to tune the work function to achieve a desired threshold voltage.

In a CMOS device, it is desireable for the PMOS transistor and the NMOS transistor to have symmetric threshold voltages $V_t$. For example, the NMOS transistor should have threshold voltage $V_{tn}$ of about +0.2 to +5 V, and the PMOS transistor should have a threshold voltage $V_{tp}$ of substantially the same negative value, e.g., about −0.2 to −5 V. However, if a high k dielectric material is used as a gate dielectric material of a CMOS device, symmetric threshold voltages may not be achievable, because the work function cannot be tuned by adjusting the doping of the polysilicon gate material.

Thus, what are needed in the art are transistor devices comprising traditional gate dielectric materials such as $SiO_2$ and SiON that do not exhibit a poly depletion effect, rather requiring the use of high k dielectric materials.

What are also needed in the art are transistor devices comprising high k dielectric materials that have a tunable work function and therefore have the ability to achieve symmetric threshold voltages $V_t$ for PMOS and NMOS transistors of CMOS devices.

The present invention will be described with respect to preferred embodiments in a specific context, namely in the formation of gate electrodes of transistors. Embodiments of the invention may also be applied, however, to other applications where other electrodes or conductive features are used.

Embodiments of the present invention achieve technical advantages by providing novel transistor devices and methods of manufacturing thereof. A thin layer of conductive material is deposited over a gate dielectric of a transistor. A layer of semiconductive material is deposited over the thin layer of conductive material. The thin layer of conductive material provides carriers for the thin layer of conductive material, preventing a poly depletion effect. The thin layer of conductive material is sufficiently thin enough to avoid affecting the work function of the transistor, e.g., the layer of semiconductive material has a dominant effect on the work function.

FIGS. 2 through 5 show cross-sectional views of a method of fabricating a semiconductor device 200 in accordance with a preferred embodiment of the present invention. Like numerals are used for the various elements that were described in FIG. 1.

Figure 2:
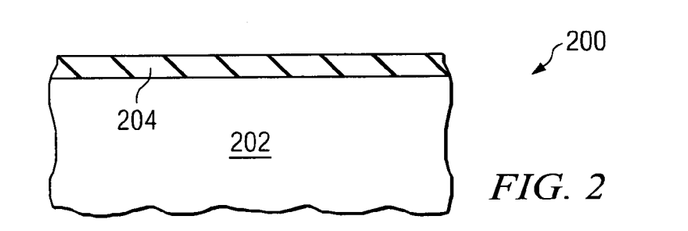
FIGS. 2 through 5 show cross-sectional views of a method of fabricating a transistor in accordance with a preferred embodiment of the present invention.

Referring to FIG. 2, first, a workpiece 202 is provided. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may comprise a silicon-on-insulator (SOI) substrate, for example.

A gate dielectric 204 is formed over the workpiece 202. The gate dielectric 204 is also referred to herein as a gate dielectric material. The gate dielectric 204 preferably comprises a thickness of about 50 Angstroms or less, for example, although alternatively, the gate dielectric 204 may comprise other dimensions. The gate dielectric 204 may be formed using chemical vapor deposition (CVD), atomic layer deposition (ALD), metal organic chemical vapor deposition (MOCVD), physical vapor deposition (PVD), or jet vapor deposition (JVD), as examples, although alternatively, other deposition methods may also be used to form the gate dielectric 204.

In some embodiments, the gate dielectric 204 preferably comprises an insulating material comprising Si combined with O, N, or both O and N, e.g., $SiO_2$, SiON, or $Si_3N_4$, as examples. The gate dielectric 204 preferably comprises a dielectric constant of about 3.9 to about 7.8 in these embodiments, for example. Using conventional dielectric materials such as $SiO_2$, SiON, or $Si_3N_4$ as a gate dielectric 204 is an advantage because the manufacturing processes for working with these materials in transistor devices are mature, for example. Furthermore, Fermi-pinning is avoided by the use of these materials as the gate dielectric 204, for example. The gate dielectric 204 may comprise one layer or multiple layers of these materials.

In other embodiments, the gate dielectric 204 may comprise a high k dielectric material having a dielectric constant of about 4.0 or greater, in one embodiment, for example. In these embodiments, the gate dielectric 204 may comprise $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_xTiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof, as examples, although alternatively, the gate dielectric material 204 may comprise other high k dielectric materials or other dielectric materials.

Figure 3:
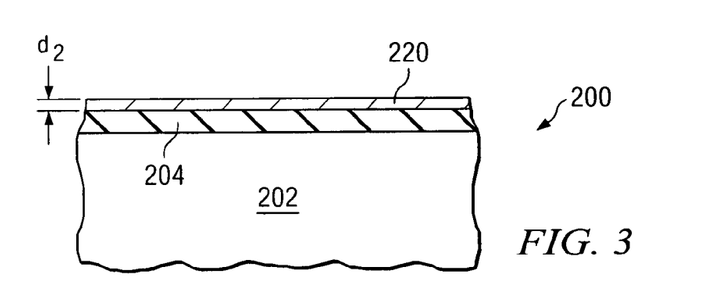

A thin layer of conductive material 220 is formed over the gate dielectric 204, as shown in FIG. 3. The thin layer of conductive material 220 preferably comprises a nitride of a metal having a thickness $d_2$ of about 50 Angstroms or less. In some embodiments, the thin layer of conductive material 220 preferably comprises a thickness $d_2$ of less than about 25 Angstroms, in some embodiments, for example. The thin layer of conductive material 220 preferably comprises a material and a thickness $d_2$ such that the thin layer of conductive material 220 has a substantially negligible effect on a work function of the transistor 230 to be formed, as shown in FIG. 5, for example, so that a subsequently-deposited layer of semiconductive material (see layer 206 in FIG. 4) has a dominant effect on the work function of the transistor 230.

The thin layer of conductive material 220 is preferably formed by PVD, for example. In some embodiments, the thin layer of conductive material 220 is preferably formed using one or more cycles of ALD, for example. The thin layer of conductive material 220 preferably comprises TiN, TaN, WN, MoN, or HfN, as examples, although other conductive materials may also be used. In some embodiments, the thin layer of conductive material 220 preferably comprises a mid-gap metal, for example. The thin layer of conductive material 220 provides carriers (e.g., holes or electrons) for current flow when a voltage is applied to the gate electrode 206/220 of the transistor 230 (see FIG. 5), to be described further herein.

Figure 4:
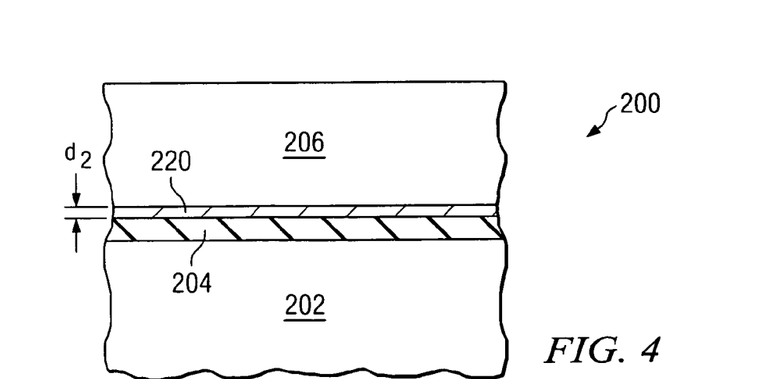

A layer of semiconductive material 206 is formed over the thin layer of conductive material 220, as shown in FIG. 4. The layer of semiconductive material 206 preferably comprises polysilicon, and may alternatively comprise amorphous silicon or other semiconductor materials, as examples. The layer of semiconductive material 206 preferably comprises a thickness of about 5,000 Angstroms or less, for example.

Figure 5:
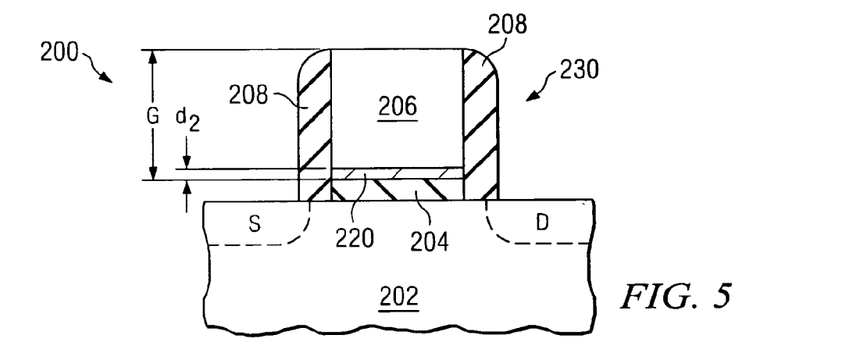

The layer of semiconductive material 206, the thin layer of conductive material 220, and the gate dielectric 204 are patterned using lithography into the shape of a transistor device 230, as shown in FIG. 5. For example, the patterned layer of semiconductive material 206, the thin layer of conductive material 220, and the gate dielectric 204 may comprise a square or rectangular shape when viewed from a top view (not shown in the drawings). The layer of semiconductive material 206, the thin layer of conductive material 220, and the gate dielectric 204 may be patterned by depositing a layer of photoresist and/or hard mask (not shown) over the layer of semiconductive material 206, patterning the layer of photoresist and/or hard mask using a lithography mask, and using the layer of photoresist and/or hard mask as a mask to pattern or etch away exposed portions of the layer of semiconductive material 206, the thin layer of conductive material 220, and the gate dielectric 204, for example.

The manufacturing process is then continued to complete the transistor device 230, as shown in FIG. 5. For example, an insulating material 208 may be deposited over the patterned layer of semiconductive material 206, the thin layer of conductive material 220, the gate dielectric 204, and exposed portions of the workpiece 202, and the insulating material 208 may be anisotropically etched to form sidewall spacers 208 on the sidewalls of the patterned layer of semiconductive material 206, the thin layer of conductive material 220, and the gate dielectric 204, as shown. The spacers 208 may comprise an insulating material such as an oxide, nitride, or combinations thereof, as examples. Exposed portions, and optionally, the semiconductive material 206 may be implanted with dopants, to form source regions S and drain regions D in the top surface of the workpiece 202 proximate the gate electrode 206/220 (e.g., gate G) and gate dielectric 204, and also to increase the conductivity of the gate 206.

The work function of the gate G is preferably established by the layer of semiconductive material 206, rather than by the thin layer of conductive material 220, according to preferred embodiments of the present invention. The thin layer of conductive material 220 preferably has no effect or a negligible effect on the work function of the transistor 230. The work function of the transistor 230 may be set to be about 4.0 eV to about 5.2 eV, depending on the amount of and type of dopants implanted into the semiconductive material 206, for example. Areas of the semiconductor device 200 may be masked while the semiconductive material 206 is implanted with a desired level of dopant species, for example (not shown). The transistor device 230 may comprise a PMOS transistor or an NMOS transistor, as examples.

Only one transistor 230 is shown in FIGS. 2 through 5; alternatively, many transistors 230 may be manufactured simultaneously in accordance with embodiments of the present invention.

Figure 6:
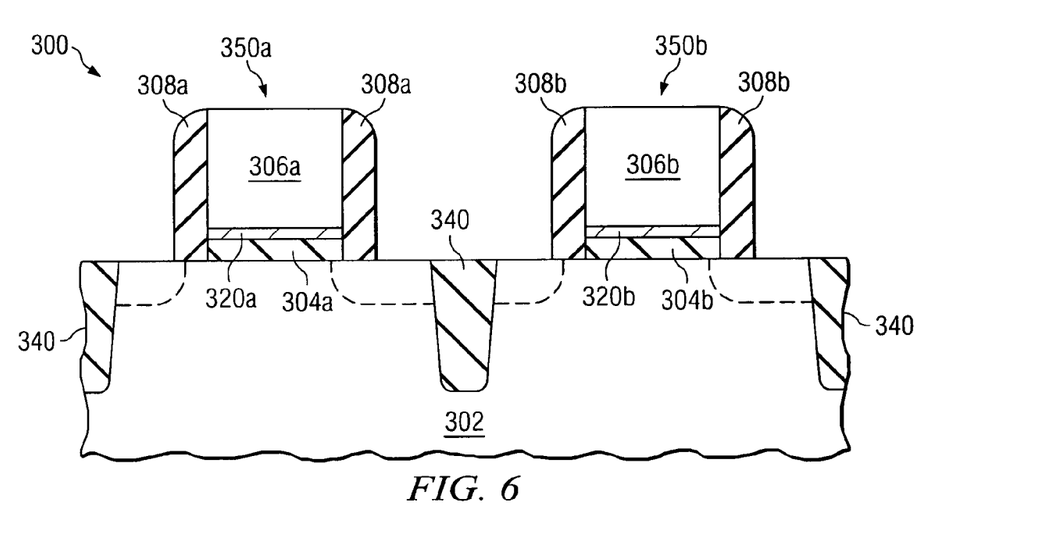
FIG. 6 illustrates a cross-sectional view of a CMOS device in accordance with an embodiment of the present invention.

Embodiments of the present invention may be implemented in a CMOS device 300, as shown in FIG. 6. Like numerals are used for the various elements that were described for the embodiment shown in FIGS. 2 through 5. To avoid repetition, each reference number shown in FIG. 6 is not described again in detail herein. Rather, similar materials x02, x04, x06, x20, etc., are preferably used for the various material layers shown as were described for FIGS. 2 through 5, where x=2 in FIGS. 2 through 5, and x=3 in FIG. 6. As an example, the preferred and alternative materials and dimensions described for the thin layer of conductive material 220 in the description for FIGS. 2 through 5 are preferably also used for the thin layer of conductive material 320a and 320b shown in FIG. 6.

FIG. 6 illustrates a cross-sectional view of a CMOS device 300 in accordance with an embodiment of the present invention. The CMOS device 300 includes a PMOS transistor 350a and an NMOS transistor 350b arranged in a complementary configuration. In a preferred embodiment, the gate dielectrics 304a and 304b are formed from a single layer of insulating material 304a/304b, the thin layers of conductive material 320a and 320b are formed from a single layer 320a/320b of thin conductive material, and the layers of semiconductive material 306a and 306b are formed from a single layer 306a/306b of semiconductive material. Advantageously, a first gate dielectric 304a of the PMOS transistor 350a and a second gate dielectric of the NMOS transistor 350b comprise the same material and thickness in this embodiment, which minimizes the number of manufacturing process steps. Similarly, a first thin layer of conductive material 320a of the PMOS transistor 350a and a second thin layer of conductive material 320b of the NMOS transistor 350b comprise the same material and thickness in this embodiment, minimizing the number of manufacturing process steps.

The layer of semiconductive material 306a of the PMOS transistor 350a may be implanted with a first dopant species, e.g., comprising a p type dopant, while the NMOS transistor 350b is masked. Likewise, the layer of semiconductive material 306b of the NMOS transistor 350b may be implanted with a second dopant species, e.g., comprising an n type dopant, while the PMOS transistor 350a is masked. The dopant levels may be selected to establish the work function of the PMOS transistor 350a and NMOS transistor 350b, for example, because the thin layers of conductive material 320a and 320b, respectively, do not substantially affect the work function of the transistors 350a and 350b, for example. Advantageously, the work functions of the transistors 350a and 350b may be tuned using the dopant concentration levels to achieve a symmetric threshold voltage $V_{tp}$ and $V_{tn}$ for the CMOS device 300.

Before depositing the material layers 304a/304b, 320a/320b, and 306a/306b, the workpiece 302 may be doped with N type dopants and P type dopants, e.g., to form an N well and P well, respectively (not shown), in the workpiece 302 for the PMOS transistor 350a and NMOS transistor 350b, respectively. The workpiece 302 may then be cleaned using a pre-gate cleaning process to remove contaminants or native oxide from the top surface of the workpiece 302. The pre-gate treatment may comprise an HF, HCl, or an ozone based cleaning treatment, as examples, although the pre-gate treatment may alternatively comprise other chemistries.

Shallow trench isolation (STI) regions 340 may be formed between what will be active areas in the PMOS and NMOS regions of the workpiece 302. If the workpiece 302 comprises an SOI substrate 302, the shallow trench isolation region 340 may be formed by patterning a top layer of semiconductive material (not shown) of the workpiece 302, and filling the patterned second layer of semiconductive material with an insulating material such as silicon dioxide, although other materials may be used, for example.

In other embodiments, the PMOS transistor 350a may be first be formed, and the NMOS transistor 350b may then be formed, or vice versa. One portion of the workpiece 302 may be covered with a mask while the insulating, conductive, and material layers are formed over the workpiece, and these materials may be removed in unwanted areas using a lift-off technique over the mask when removing the mask, for example. In this embodiment, the first gate dielectric 304a of the PMOS transistor 350a and the second gate dielectric 304b of the NMOS transistor 350b may comprise different materials and/or different thicknesses (not shown). Likewise, the first thin layer of conductive material 320a of the PMOS transistor 350a and the second thin layer of conductive material 320b of the NMOS transistor 350b may comprise different materials and/or different thicknesses (not shown).

After the transistor 230 shown in FIG. 5 and the transistors 350a and 350b shown in FIG. 6 are formed, processing of the semiconductor devices 200 and 300 is then continued, such as forming insulating and conductive layers over the transistors 230, 350a, and 350b, as examples (not shown). For example, one or more insulating materials (not shown) may be deposited over the transistors 230, 350a, and 350b, and contacts may be formed in the insulating materials in order to make electrical contact with the top surface of the semiconductive material 206, 306a, and 360b of the gate electrodes and source and/or drain regions S and D. Additional metallization and insulating layers may be formed and patterned over the top surface of the insulating material and contacts. A passivation layer (not shown) may be deposited over the insulating layers of the transistors 230, 350a, and 350b. Bond pads (also not shown) may be formed over the contacts, and a plurality of the semiconductor devices 200 and 300 may then be singulated or separated into individual die. The bond pads may be connected to leads of an integrated circuit package (not shown) or other die, for example, in order to provide electrical contact to the transistors 230, 350a, and 350b of the semiconductor devices 200 and 300.

The novel thin layer of conductive material 220, 320a and 320b described herein functions as a carrier source when the transistors 230, 350a, and 350b are in operation, avoiding a poly depletion effect. The novel transistors 230, 350a, and 350b have gates G, 306a/320a, and 306b/320b that include the thin layer of conductive material 220, 320a, and 320b, and also include a thicker layer of semiconductive material 206, 306a, and 306b that is doped with an appropriate dopant species for a particular type of transistor, e.g., PMOS transistors include a layer of semiconductive material 206 and 306a that is preferably doped with a p type material, and NMOS transistors include a layer of semiconductive material 206 and 306b that is preferably doped with an n type material.

Advantageously, the gate dielectric 204, 304a, and 304b may comprise traditional gate dielectric materials, such as $SiO_2$, SiON, or $Si_3N_4$, so that the manufacturing process is easily implemented into existing manufacturing process flows. The thin layer of conductive material 220, 320a, and 320b is also easily implementable into existing manufacturing process flows: for example, if the thin layer of conductive material 220, 320a, and 320b comprises TiN, the thin layer of TiN may be formed by introducing a Ti precursor into a deposition chamber simultaneously while introducing a nitrogen-containing gas such as $NH_3$, for example.

Another advantage of embodiments of the present invention is the prevention of boron diffusion. For example, if the transistor 230, 350a comprises a PMOS transistor and the layer of semiconductive material 206 and 306a is implanted with boron, the thin layer of conductive material 220 and 320a prevents boron from diffusing into the gate dielectric 204 and 304a, for example. If the thin layer of conductive material 220 and 320a comprises a nitride material, for example, nitride provides an excellent diffusion barrier for boron, for example.

Figure 7:
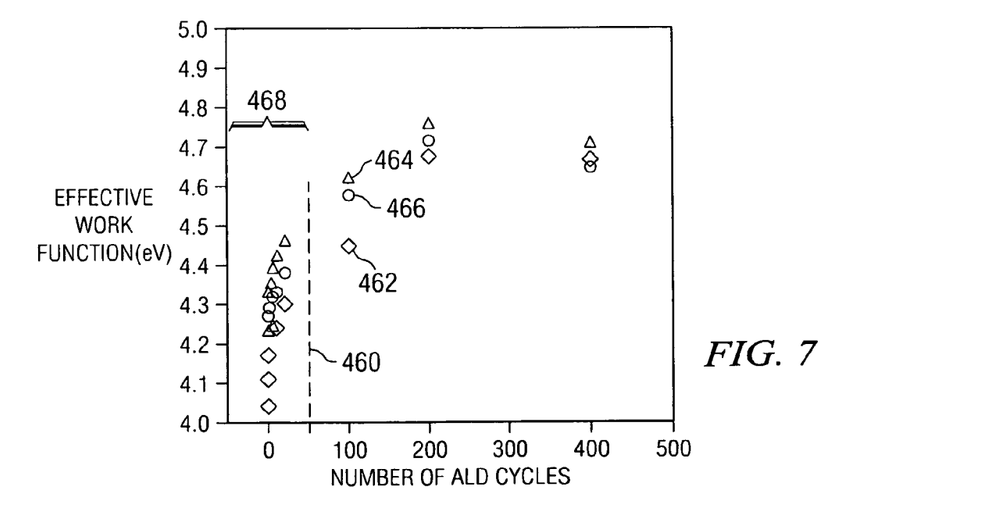
FIG. 7 is a graph showing the effect of a thin layer of conductive material comprising TiN on the effective work function of a transistor for three types of gate dielectric materials.

FIG. 7 is a graph showing the effect of a thin layer of conductive material (e.g., 220, 320a, or 320b) comprising TiN on the effective work function of a transistor for three types of gate dielectric materials for an increasing number of ALD deposition cycles. For example, as the number of ALD deposition cycles is increased, the thin layer of conductive material 220 thickness is increased. Effective work function measurements in eV are shown at 462 for a gate dielectric 204 comprising $SiO_2$ and a thin layer of conductive material 220 comprising TiN, at 464 for a gate dielectric 204 comprising $HfSiO_x$ and a thin layer of conductive material 220 comprising TiN, and at 466 for a gate dielectric 204 comprising $HfO_2$ and a thin layer of conductive material 220 comprising TiN. The thinner the thin layer of conductive material 220 is (e.g., fewer ALD cycles are used to form the thin layer of conductive material 220), the more the work function of the electrode stack (e.g., including the thin layer of conductive material 220 and the layer of semiconductive material 206) is controlled by the level of dopant in the layer of semiconductive material 206. For example, on the right side of the graph, e.g., at 400 cycles, the work function of the electrode stack is controlled by the thin layer of conductive material 220. Therefore, preferably, in accordance with embodiments of the present invention, the thin layer of conductive material 220 is preferably formed using about 50 cycles of ALD, as shown at 460. In another embodiment of the present invention, the thin layer of conductive material 220 is preferably formed using about 50 cycles of ALD or less, as shown at 468. In another embodiment, the thin layer of conductive material 220 is preferably formed using about 100 cycles or less of ALD, as examples.

In Table 1, measurements of the work function of a layer of semiconductive material 206 comprising n doped polysilicon formed on a gate dielectric 204 comprising $SiO_2$ are shown for various dimensions of the thin layer of conductive material 220.

TABLE 1

| Thickness of thin layer of conductive material 220 (in Angstroms) | Thin layer of conductive material 220 comprising WN | Thin layer of conductive material 220 comprising MoN |
|---|---|---|
| 0 | 4.03 | 4.04 |
| 5 | 4.27 | 4.30 |
| 10 | 4.22 | 4.20 |
| 15 | 4.21 | 4.17 |
| 20 | 4.26 | — |
| 25 | — | 4.14 |
| 100 | 4.60 | 4.52 |

In Table 2, measurements of the work function of a layer of semiconductive material 206 comprising p doped polysilicon formed on a gate dielectric 204 comprising $SiO_2$ are shown for various dimensions of the thin layer of conductive material 220.

TABLE 2

| Thickness of thin layer of conductive material 220 (in Angstroms) | Thin layer of conductive material 220 comprising WN | Thin layer of conductive material 220 comprising MoN |
|---|---|---|
| 0 | 5.14 | 5.20 |
| 5 | 4.67 | 4.71 |
| 10 | 4.57 | 4.64 |
| 15 | 4.53 | 4.55 |
| 20 | — | — |
| 25 | — | 4.44 |
| 100 | 4.60 | 4.52 |

Comparing Table 2 to Table 1, it can be seen that the thinner the thin layer of conductive material 220 is, the greater the difference between the work function is, and lower work functions are achieved, illustrating that embodiments of the present invention are useful in CMOS applications. For example, referring to FIG. 6, if the gate dielectric 304a and 304b comprises $SiO_2$, the thin layer of conductive material 320a and 320b comprises about 5 Angstroms of MoN, and the layer of semiconductive material 306a and 306b comprises polysilicon doped with n type or p type dopants for the NMOS transistor 350b and PMOS transistor 350a, respectively, about a 400 mV work function difference is achieved (e.g., 4.71 eV in Table 2 less 4.3 eV in Table 1) between the NMOS and PMOS transistors 350b and 350a, which is a sufficient amount of work function difference for many CMOS low standby power (LSTP) device applications, for example. This embodiment may be particularly beneficial when the workpiece comprises an SOI substrate, for example.

In Table 3, measurements of the work function of a layer of semiconductive material 206 comprising n doped polysilicon formed on a gate dielectric 204 comprising $HfO_2$ are shown for various dimensions of the thin layer of conductive material 220.

TABLE 3

| Thickness of thin layer of conductive material 220 (in Angstroms) | Thin layer of conductive material 220 comprising WN | Thin layer of conductive material 220 comprising MoN |
|---|---|---|
| 0 | 4.24 | 4.25 |
| 5 | — | 4.29 |
| 10 | 4.3 | 4.26 |
| 15 | 4.32 | 4.26 |
| 20 | 4.36 | 4.25 |

In Table 4, measurements of the work function of a layer of semiconductive material 206 comprising p doped polysilicon formed on a gate dielectric 204 comprising $HfO_2$ are shown for various dimensions of the thin layer of conductive material 220.

TABLE 4

| Thickness of thin layer of conductive material 220 (in Angstroms) | Thin layer of conductive material 220 comprising WN | Thin layer of conductive material 220 comprising MoN |
|---|---|---|
| 0 | 4.00 | 4.23 |
| 5 | 4.34 | 4.32 |
| 10 | 4.3 | 4.27 |
| 15 | 4.33 | 4.24 |
| 20 | 4.35 | 4.25 |

Comparing Table 4 to Table 3, it can be seen that for WN, the thinner the thin layer of conductive material 220 is, the greater the difference between the work function is, illustrating that embodiments of the present invention are useful in CMOS applications. WN is an effective material to use for the thin layer of conductive material 220, even when a high k dielectric material is used for the gate dielectric 204, in accordance with embodiments of the present application.

In accordance with some embodiments of the present invention, it may be advantageous to use a different high k dielectric material for a PMOS transistor 350a (e.g., as shown in FIG. 6) than for an NMOS transistor 350b of a CMOS device 300, as described in U.S. patent application Ser. No. 11/187,197, filed on Jul. 21, 2005, entitled, "CMOS Transistors With Dual High-k Gate Dielectric and Methods of Manufacture Thereof"; and Ser. No. 10/870,616, filed on Jun. 17, 2004, entitled, "CMOS Transistor With Dual High-k Gate Dielectric and Method of Manufacture Thereof"; which are incorporated herein by reference.

As an example, referring to Tables 3 and 4, if the gate dielectrics 304a and 304b both comprise $HfO_2$, the thin layer of conductive material 320a and 320b both comprise about 5 Angstroms of MoN, and the layer of semiconductive material 306a and 306b both comprise polysilicon doped with n type dopants for the NMOS transistor 350b and doped with p type dopants for the PMOS transistor 350a, then there would be less than a 50 mV difference in the work function between the NMOS transistor 350b and the PMOS transistor 350a (e.g., 4.32 in Table 4 less 4.29 in Table 3), which is not a sufficient work function difference for some CMOS applications. Therefore, in order to have a large enough work function separation for the PMOS transistor 350a and NMOS transistor 350b, it is preferable to use two different high-k dielectric materials for the gate dielectric 304b and 304a of the NMOS and PMOS transistors 350b and 350a, respectively.

For example, in one preferred embodiment, the gate dielectric 304a of the PMOS transistor 350a preferably comprises a first layer of HfSiO and a second layer of $Al_2O_3$ disposed over the first layer of HfSiO, and the gate dielectric 304b of the NMOS transistor 350b preferably comprises a single layer of HfSiO. The thin layer of conductive material 320a and 320b may comprise about 50 Angstroms or less of metal such as TiN, and the layer of semiconductive material 306a and 306b may comprise doped polysilicon. Using these gate stack structure materials, for example, a wider separation of work functions for the NMOS transistor 350b and the PMOS transistor 350a is achievable, which is needed in many CMOS applications, for example.

Advantages of embodiments of the invention include solving the poly depletion problem exhibited in many transistor designs. The $T_{inv}$ can be reduced, resulting in improved device performance, while simultaneously reducing boron penetration. Traditional $SiO_2$ or SiON gate dielectric materials may be used, avoiding concerns of reliability problems that may be an issue with the use of some high-k dielectric materials, for example. In CMOS applications, a single thin layer of conductive material 320a/320b may be formed, avoiding integration issues with a dual metal scheme.

Embodiments of the present invention may be applied in many types of applications, and are particularly useful in transistor applications where low power and high speed are a concern. Embodiments of the present invention are also particularly useful in reduced scale or size transistor designs, for example.

Figure 8:
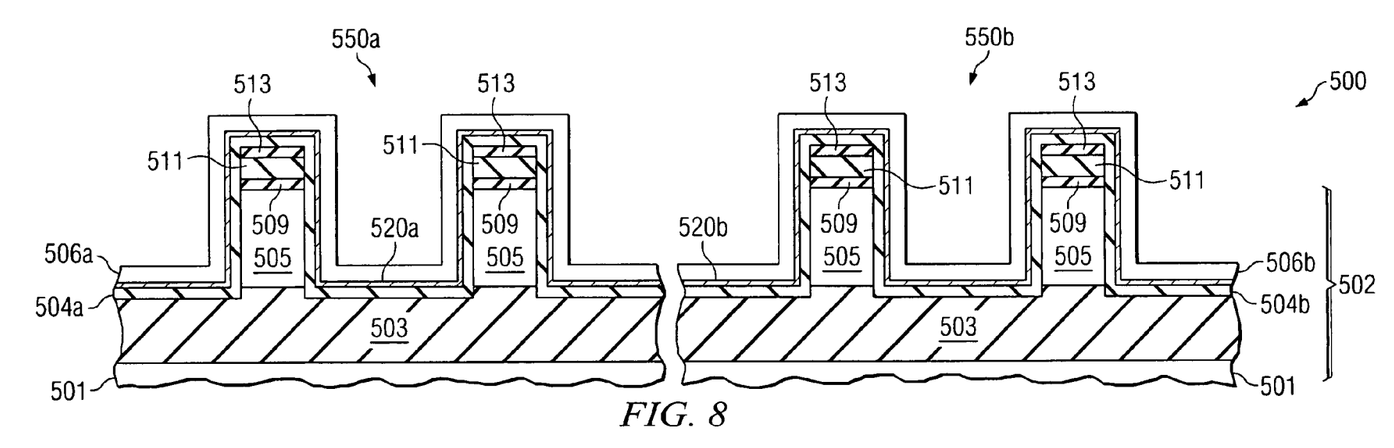
FIG. 8 shows an embodiment of the present invention implemented in a FinFET device.
Figure 9:
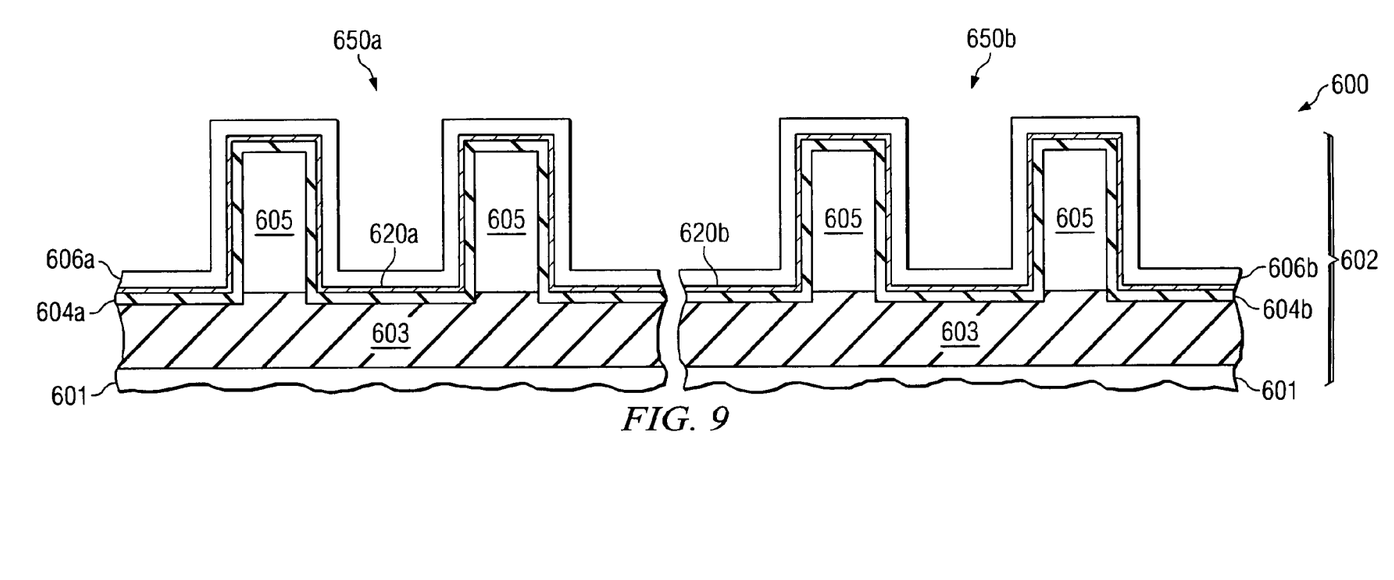
FIG. 9 shows an embodiment of the present invention implemented in a tri-gate FET device.

Embodiments of the present invention also have useful application in multi-gate transistors, or multi-gate field effect transistors (MugFETs), as shown in FIGS. 8 and 9. Again, like numerals are used for the various elements that were described for the embodiments shown in FIGS. 2 through 5 and FIG. 6, and to avoid repetition, each reference number shown in FIGS. 8 and 9 is not described again in detail herein. Rather, similar materials x02, x04, x06, x20, etc., are preferably used for the various material layers shown as were described for FIGS. 2 through 5 and 6, where x=2 in FIGS. 2 through 5, x=3 in FIG. 6, x=5 in FIG. 8, and x=6 in FIG. 9.

MugFETs are an emerging transistor technology. A double gate transistor has two parallel gates that face each other and control the same channel region. A finFET is a vertical double gate device, wherein the channel comprises a vertical fin comprising a semiconductor material, which may be formed on a silicon-on-insulator (SOI) substrate, for example. The two gates of a finFET are formed on opposing sidewalls of the vertical fin. A tri-gate transistor has three gates that control the same channel region, e.g., the channel comprises the vertical fin, two of the gates are formed on the sides of the vertical fin, and a third gate is formed on the top of the fin. A finFET structure is similar to a tri-gate transistor, with the third gate being blocked by an insulating material or hard mask disposed on top of the fin, for example.

Two or more MugFETs may be formed in parallel to form an NMOS transistor 550b and 650b and PMOS transistor 550a and 550b of a CMOS MugFET device, as shown in FIGS. 8 and 9. FIG. 8 shows an embodiment of the present invention implemented in a FinFET device, wherein two gate electrodes 520a/506a and 520b/506b are disposed on the sidewalls of each fin structure 505. FIG. 9 shows an embodiment of the present invention implemented in a tri-gate FET, wherein two gate electrodes 620a/606a and 620b/606b are disposed on the sidewalls of each fin structure 605, and a third gate electrode 620a/606a and 620b/606b is disposed on the top of each fin structure 605. The novel thin layer of conductive material 520a, 520b, 620a, and 620b is formed between the gate dielectric 504a, 504b, 604a, and 604b, and the layer of semiconductive material 506a, 506b, 606a, and 606b, as shown.

To form the novel FinFET transistors 550a and 550b and Tri-gate FETs 650a and 650b shown in FIGS. 8 and 9, a workpiece 502 and 602 comprising an SOI substrate is provided. Referring to FIG. 8, the SOI substrate 502 includes a first layer of semiconductive material 501 that comprises a substrate, a buried insulating layer 503 or buried oxide layer disposed over the first layer of semiconductive material 501, and a second layer of semiconductive material 505 disposed over the buried insulating layer 503, for example. The second layer of semiconductor material 505 may comprise silicon (Si) having a thickness of about 100 nm, for example, although alternatively, the second layer of semiconductor material 505 may comprise other materials and dimensions.

A hard mask 509/511/513 is formed over the workpiece 502. The hard mask 509/511/513 comprises a first oxide layer 509 comprising about 5 nm or less of SiO$_2$ formed over the workpiece 502. A nitride layer 511 comprising about 20 nm of Si$_x$N$_y$ is formed over the first oxide layer 509. A second oxide layer 513 comprising about 20 nm or less of SiO$_2$ is formed over the nitride layer 511. Alternatively, the hard mask 509/511/513 may comprise other materials and dimensions, for example.

The hard mask 509/511/513 is patterned using lithography, e.g., by depositing a layer of photoresist (not shown) over the hard mask 509/511/513, exposing the layer of photoresist to energy using a lithography mask, developing the layer of photoresist, and using the layer of photoresist as a mask to pattern the hard mask 509/511/513, for example. The hard mask 509/511/513, and optionally, also the layer of photoresist, are used as a mask to pattern the second layer of semiconductive material 505 of the workpiece 502 to form fin structures 505 in the layer of semiconductive material 505, as shown in FIG. 8. The buried insulating layer 503 may comprise an etch stop layer for the etch process of the second layer of semiconductive material 505, for example. A top portion of the buried insulating layer 503 may be removed during the etch process of the second layer of semiconductive material 505, as shown. For example, the buried insulating layer 503 may have a thickness of about 150 nm, and may be etched by about 15 nm or less.

The second layer of semiconductor material 505 of the SOI substrate or workpiece 502 forms vertical fins of semiconductor material 505 extending in a vertical direction away from a horizontal direction of the workpiece 502. The fin structures 505 will function as the channels of PMOS and NMOS transistors 550a and 550b. The fin structures 505 may also be formed on a bulk substrate 502, for example. The fin structures 505 have a thickness that may comprise about 50 nm or less, as an example, although alternatively, the fins 505 may comprise other dimensions. For example, the thickness of the fin structures 505 may comprise about 5 to 60 nm, or less, in some applications. As another example, the thickness of the fin structures 505 may be larger, having a thickness of about 100 to 1,000 nm, as another example. The thickness of the fin structures 505 may vary as a function of the channel doping and other dimensions of the fin structures 505, as examples, although other parameters may also have an effect on the determination of the dimension of the fin structure 505 thickness.

The fin structures 505 have a height that is substantially equivalent to the thickness of the second layer of semiconductor material 505, for example. Only two fin structures 505 are shown for the PMOS transistor 530a and the NMOS transistor 530b; however, there may be many fin structures 505, e.g., about 1 to 200 fin structures 505 for each PMOS and NMOS transistor 530a and 530b, respectively, although alternatively, other numbers of fin structures 505 may be used.

After the fin structures 505 are formed, then the gate dielectric 504a and 504b, the thin layer of conductive material 520a and 520b, and the layer of semiconductive material 506a and 506b are deposited sequentially over the fin structures 505, as shown in FIG. 8, and the manufacturing process is continued, as previously described herein, for example. A first gate electrode is formed on a left sidewall of each fin structure 505 comprised of the thin layer of conductive material 520a and the layer of semiconductive material 506a, and a second gate electrode is formed on a right sidewall of each fin structure 505 comprised of the thin layer of conductive material 520a and the layer of semiconductive material 506a, for example.

In FIG. 9, to form Tri-gate FETs 650a and 650b, before the gate dielectric 604a and 604b is deposited, the hard mask (e.g., hard mask 509/511/513 shown in FIG. 8) is removed. A first gate electrode is formed on a left sidewall of each fin structure 605 comprised of the thin layer of conductive material 620a and the layer of semiconductive material 606a, and a second gate electrode is formed on a right sidewall of each fin structure 605 comprised of the thin layer of conductive material 620a and the layer of semiconductive material 606a, for example. A third gate electrode is formed on the top surface of each fin structure 605 comprised of the thin layer of conductive material 620a and the layer of semiconductive material 606a.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An intermediate state of a semiconductor device comprising:
 a gate dielectric disposed over a workpiece;
 a layer of conductive material comprising a thickness of about 30A° or less disposed over and in contact with the gate dielectric, the layer of conductive material comprising metal nitride;
 a layer of semiconductive material disposed over and in contact with the 30A° thick layer of conductive material, the layer of semiconductive material and the layer of conductive material patterned to define a plurality of gate electrodes;
 a p-type dopant implanted in the layer of semiconductor material of a portion of said plurality of gate electrodes to form p-channel semiconductor devices;
 an n-type dopant implanted in the layer of semiconductor material of another portion of said plurality of gate electrodes to form n-channel semiconductor devices; and
 a source region and a drain region formed in the workpiece proximate the gate dielectric.

2. The semiconductor device according to claim 1, wherein the layer of conductive material comprises a thickness such that the layer of conductive material has a substantially negligible effect on a work function of the transistor.

3. The semiconductor device according to claim 1, wherein the gate dielectric comprises a dielectric constant of about 3.9 to about 7.8.

4. The semiconductor device according to claim 1, wherein the gate dielectric comprises an insulating material comprising Si combined with O, N, or both O and N.

5. The semiconductor device according to claim 1, wherein the gate dielectic comprises a dielectric constant of about 4.0 or greater, and wherein the gate dielectric comprises $HfO_2$, $HfSiO_x$, $Al_2O_3$, $ZrO_2$, $ZrSiO_x$, $Ta_2O_5$, $La_2O_3$, $SiO_2$, $TiO_2$, $CeO_2$, $Bi_4Si_2O_{12}$, $WO_3$, $Y_2O_3$, $LaAlO_3$, BST ($Ba_{(a-x)}Sr_x TiO_3$), PST ($PbSc_xTa_{(1-a)}O_3$), nitrides thereof, $Si_xN_y$, SiON, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, PZN ($PbZn_xNb_{(1-x)}O_3$), PZT ($PbZr_xTi_{(1-x)}O_3$), PMN ($PbMg_xNb_{(1-x)}O_3$), combinations thereof, or multiple layers thereof.

6. The semiconductor device according to claim 1, wherein the semiconductor device comprises parts of CMOS devices.

7. The semiconductor device according to claim 6, wherein the CMOS devices comprise semiconductor devices with symmetric threshold voltages.

8. The semiconductor device according to claim 1, wherein the metal nitride is MoN.

* * * * *